United States Patent [19]

Webster et al.

[11] Patent Number: 5,300,888
[45] Date of Patent: Apr. 5, 1994

[54] NMR THERMAL ANALYZER

[75] Inventors: David S. Webster, Dundas; Leo J. Lynch, Kingsford, both of Australia

[73] Assignee: Commonwealth Scientific and Industrial Research Organisation, Australia

[21] Appl. No.: 849,412

[22] PCT Filed: Oct. 29, 1990

[86] PCT No.: PCT/AU90/00519

§ 371 Date: Apr. 29, 1992

§ 102(e) Date: Apr. 29, 1992

[87] PCT Pub. No.: WO91/06847

PCT Pub. Date: May 16, 1991

[30] Foreign Application Priority Data

Nov. 7, 1989 [AU] Australia .............. PJ7264
May 7, 1990 [AU] Australia .............. PJ9977

[51] Int. Cl.[5] .................................... G01R 33/20
[52] U.S. Cl. ........................... 324/315; 324/300
[58] Field of Search .......... 324/300, 301, 302, 315, 324/307, 318; 364/577

[56] References Cited

U.S. PATENT DOCUMENTS

| | | | |
|---|---|---|---|
| 3,502,964 | 3/1970 | Freeman | 324/301 |
| 4,461,996 | 7/1984 | Kwon | 324/315 |
| 4,914,608 | 4/1990 | LeBihan et al. | 364/557 |
| 5,015,954 | 5/1991 | Dechene et al. | 324/307 |

FOREIGN PATENT DOCUMENTS

| | | |
|---|---|---|
| 14900/83 | 1/1983 | Australia . |
| 0337908 | 10/1989 | European Pat. Off. . |
| 0343858 | 11/1989 | European Pat. Off. . |

OTHER PUBLICATIONS

Patent Abstract of Japan, vol. 7, No. 278 (P-242)(1423), Dec. 10, 1983, JP-A-58 155 345 (Nippon Denshi K.K.), Sep. 16, 1983.
Analytical Chemistry, vol. 50, No. 2, Feb. 1, 1978, Columbus, Ohio, pp. 298-303; D. W. Vidrine, et al., "Feedback Excitation Nuclear Magnetic Resonance Spectrometry and Its Application to Simultaneous Temperature Excitation Measurement".
Analytical Chemistry, vol. 60, No. 9, May 5, 1988, Columbus, Ohio, pp. 559A-570A; J. F. Haw "Variable-Temperature Solid-State NMR Spectroscopy".
Derwent Abstract Accession No. 86-224655/34, SU 1206663 (Nuclear Geophys Chem) Jan. 23, 1986.
Derwent Abstract Accession No. 84-125625/20, SU 1035491 (Kazan Lenin Univ) Aug. 15, 1983.
Derwent Abstract Accession No. 84-281039/45, SU 1078299 (As Urals Sci Cent) Mar. 7, 1984.

Primary Examiner—Michael J. Tokar
Attorney, Agent, or Firm—Hill, Steadman & Simpson

[57] ABSTRACT

A method is provided for carrying out proton magnetic resonance thermal analysis measurements. To this end, the method provides locating a sample within a coil forming part of an RF tuned circuit and applying a magnetic field to the sample. The sample is heated in accordance with a predetermined temperature regime. Pulsed RF energy is applied to the coil to generate a pulsed RF electromagnetic field which is applied to the sample. The magnitude of the magnetic field is adjusted to insure that the NMR frequency of the sample is substantially identical to the RF frequency. The resonant frequency of the tuned circuit is adjusted to compensate for temperature induced changes in the tuned circuit components and the sample. The energy of the pulsed RF energy is adjusted to obtain an optimum output from the RF tuned circuit. The RF tuned circuit output is recorded as a function of either time or temperature of the sample. A proton magnetic resonance thermal analyzer is further provided as well as a high temperature heater probe for nuclear magnetic resonance measurements.

14 Claims, 4 Drawing Sheets

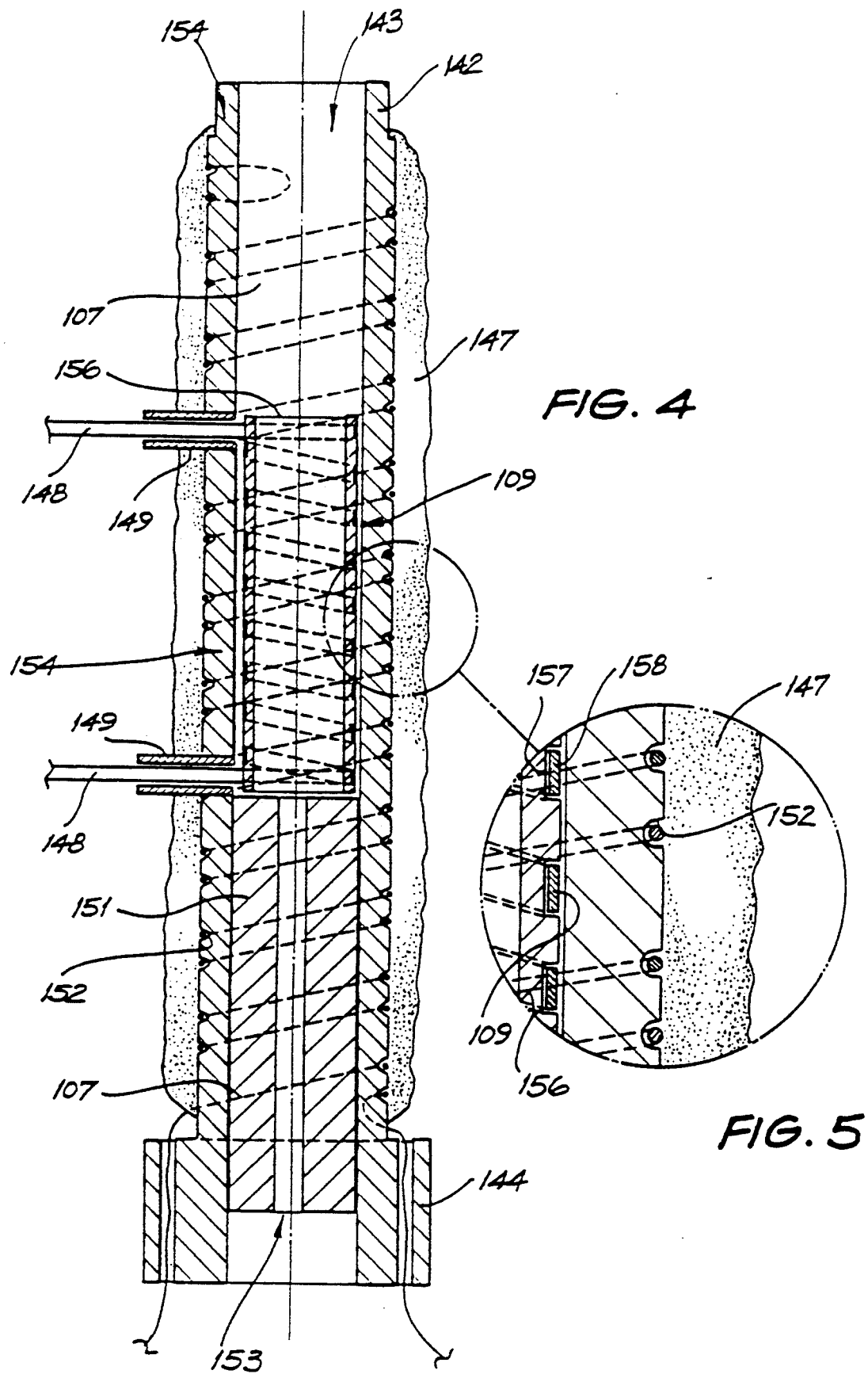

NMR THERMAL ANALYZER

The present invention relates to nuclear magnetic nuclear resonance (NMR), and, in particular, to the thermal analysis of various substances by use of the process known as proton magnetic resonance thermal analysis (PMRTA).

BACKGROUND OF THE INVENTION

It is known to take such NMR measurements with the sample held at, or near, room temperature by use of commercially available equipment known as an NMR spectrometer. One such spectrometer which is commercially available is the BRUKER MINISPEC manufactured by Bruker of Germany. While this device has a price which is within an acceptable range, the device suffers from the disadvantage that the temperature range at which measurements can be taken is limited. As the temperature controlled probes used with this device are water cooled, the maximum temperature at which any measurement can be taken is approximately 100° C.

Another NMR spectrometer which is commercially available is that sold under the trade name MAG-NEPULSE PC/AT 2000 by Auburn International Inc. of Danvers, Mass., U.S.A. Again this device operates at a substantially constant temperature.

However, many substance-q such as coal, NYLON, KEVLAR (Registered Trade Marks) and generally any solid, semi-solid or liquid organic material including polymers are desirably subjected to PMRTA. As such substances are heated they undergo various transformations from an initial equilibrium state to a final equilibrium state. The intermediate states are inherently non-equilibrium and transient. Thus, in order to capture information about these intermediate states, the measurement techniques would ideally be instantaneous. In practice this ideal is never met but practical results can be achieved if the time resolution of the in-situ measurement is adequate to monitor phenomena of interest. The NMR properties, which reflect the physical and chemical properties of the substance, are required to be recorded and monitored as a function of temperature and time as the substance is subjected to a controlled temperature program.

The measurement difficulties arise because of the continually changing nature of the properties of the specimen and the measurement equipment during the course of the analysis. For example, the dielectric properties of the specimen, coil resistance, and other electrical properties of the resonant radio frequency (RF) circuit change during the temperature changes. An analogy may be drawn to attempting to take fast exposure photographic snap shots of an object having a variable distance from the lens while the lens itself is changing its shape.

OBJECT OF THE INVENTION

It is the object of the present invention to provide a method of, and apparatus for, carrying out proton magnetic resonance thermal analysis measurements. This method and apparatus is capable of being substantially automated.

In carrying out such measurements, it is necessary to heat a small sample of the material to be analyzed to high temperatures in the absence of other hydrogen or proton containing material. The sample is held within a probe which is itself located within a magnetic field. The performance of the probe is largely dependent upon its mechanical, electrical and structural properties. It is an ancillary object of the present invention to provide a probe construction which enables the probe to be fabricated without undue difficulty and which enables accurate results to be achieved from the NMR measurements.

SUMMARY OF THE INVENTION

According to one aspect of the present invention there is disclosed a method of carrying out proton magnetic resonance thermal analysis measurements, said method comprising the steps of:

i) locating a sample within a coil forming part of an RF tuned circuit and applying a magnetic field to said sample, ii) heating said sample in accordance with a predetermined temperature regime, iii) applying pulsed RF energy to said coil to generate a pulsed RF electromagnetic field which is applied to said sample, and thereafter substantially simultaneously, iv) adjusting the magnitude of said magnetic field to ensure that the NMR frequency of said sample is substantially identical to the RF frequency, v) adjusting the resonant frequency of the tuned circuit, if necessary, to compensate for temperature induced changes in the tuned circuit components and sample, vi) adjusting the energy of said pulsed RF energy to obtain an optimum output from said RF tuned circuit, vii) recording the RF tuned circuit output as a function of either the time or the temperature of said sample, and viii) repeating steps (iv) to (vi) as necessary at each desired time or sample temperature to obtain an optimum RF tuned circuit output, and repeating step (vii).

Preferably the power of the RF energy Is adjusted by adjusting the pulse width of the RF pulses.

In accordance with another aspect of the present invention, there is disclosed a proton magnetic resonance thermal analyzer comprising an RF tuned circuit including an RF coil into which an NMR sample is insertable, said RF coil being locatable in a magnetic field, magnetic field strength means to adjust the magnitude of said magnetic field, RF pulse means connected to said RF tuned circuit to supply same with pulsed RF energy, an RF controller connected to said RF pulse means to adjust the magnitude of said RF energy, an RF tuner connected to said RF tuned circuit and a heater to substantially increase the temperature of said sample above ambient temperature, wherein each of said magnetic field strength means, said RF controller, said RF tuner and said heater is connected to a central processing unit and is both simultaneously and individually controlled thereby.

According to a still further aspect of the present invention, there is disclosed a high temperature heater probe for nuclear magnetic resonance measurements, said probe comprising an elongate body having an opening at one end, a tubular former carrying an RF coil located within said opening with the electrical connections to said RF coil passing through said body, the interior of said former being dimensioned to receive a NMR sample holder, a heater coil non-inductively wound along said elongate body and a layer of heat resistant substantially proton deficient cement covering said heater coil and through which said electrical connections to said RF coil pass.

Preferably the opening in said body takes the form of a slotted cylindrical opening, the RF coil connections passing through the slot. In addition, the substantially proton deficient cement is preferably alumina-silicate cement.

BRIEF DESCRIPTION OF THE DRAWINGS

Some embodiments of the present invention will now be described with reference to the drawings in which:

FIG. 4 is a centrally located longitudinal cross-sectional view through the probe of FIG. 3, and FIG. 5 is an enlarged portion of FIG. 4.

DETAILED DESCRIPTION OF THE PRESENTLY PREFERRED EMBODIMENTS

Figure 1:
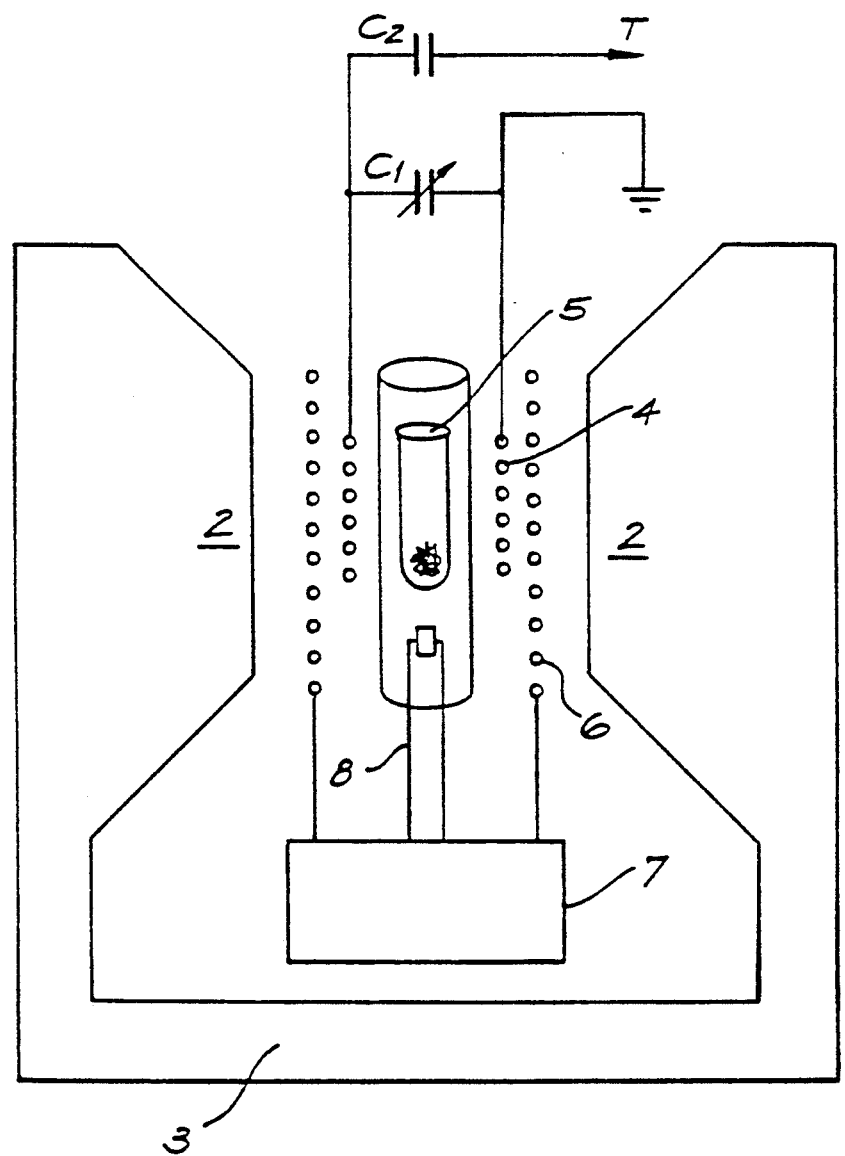
FIG. 1 is a schematic side elevation of a prior art manually operable proton magnetic resonance thermal analyzer.
Figure 2:
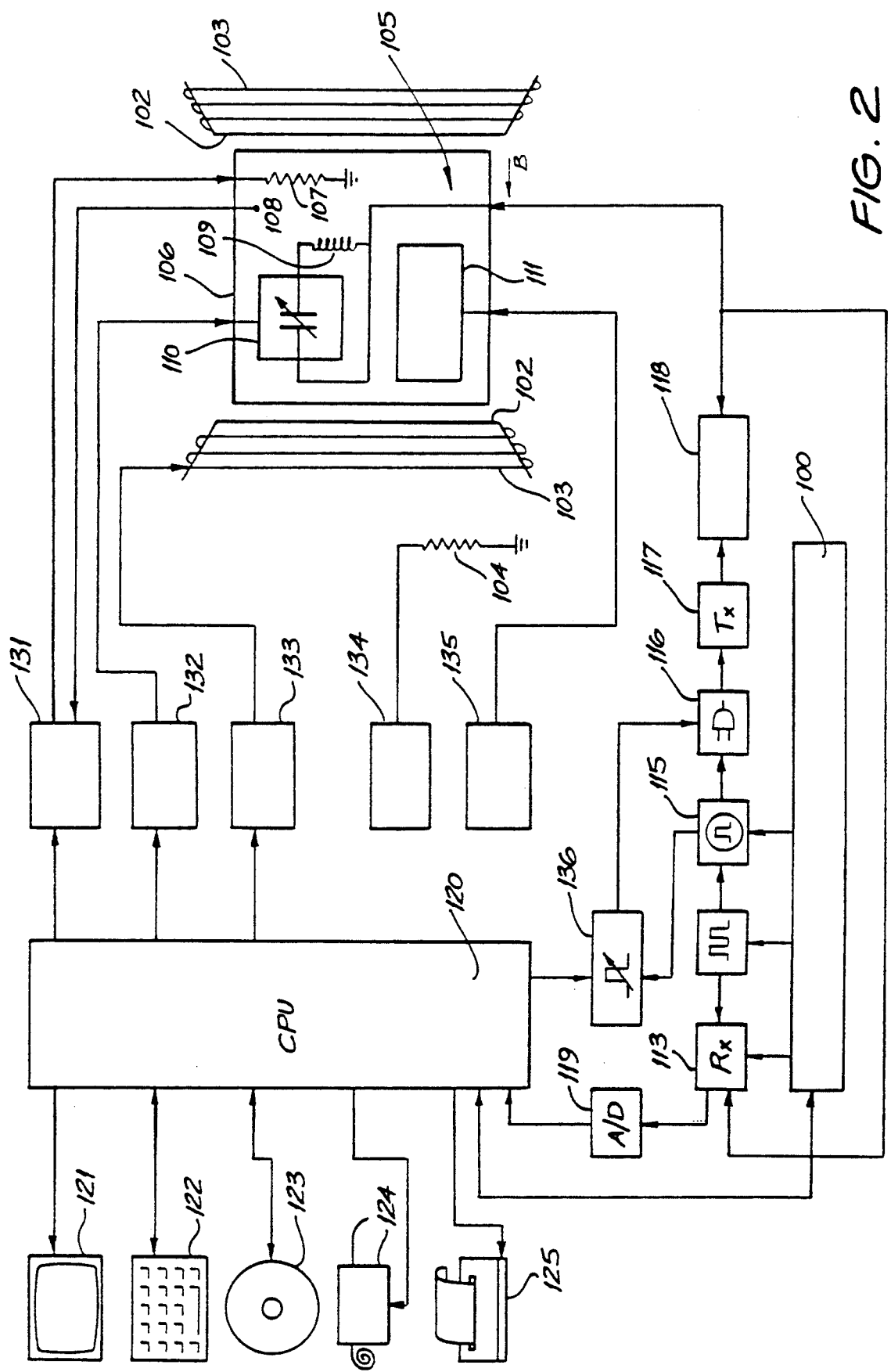
FIG. 2 is a schematic side elevation and block diagram view of the preferred embodiment of a substantially automatic proton magnetic resonance thermal analyzer based upon the above mentioned BRUKER MINISPEC.

As seen in FIG. 1, a pair of permanent magnet magnetic pole pieces 2 are provided having a yoke 3 of adjustable magnetic reluctance. This can take the form of a screw threaded member (not illustrated) which is rotatable to adjust the reluctance. Alternative arrangements include current adjustment for an auxiliary field coil. The electrical adjustment to be described in FIG. 2 is preferred over the abovementioned mechanical adjustment.

Between the pole pieces 2 is located an RF coil 4 which is connected in parallel with an adjustable capacitor C1 to form an RF parallel tuned circuit. Series tuned circuit configurations are also possible. A coupling capacitor C2 is also provided to connect the tuned circuit to RF input/output terminals T.

Within the RF coil 4 is a sample holder 5. A thermocouple 8 is located below the sample holder 5. Exterior to the RF coil 4 is a heating coil 6 the operation of which is controlled via temperature controller 7 to which both the heating coil 6 and thermocouple 8 are connected.

In operation, the temperature controller 7 is set to a predetermined controlled temperature regime and the sample within the sample holder 5 is heated in accordance with that regime. Pulsed RF energy is applied to the RF tuned circuit via terminals T. The frequency of this energy is substantially identical to the NMR frequency of the sample so that an induced NMR signal is generated which forms the output of the apparatus and appears at terminals T at the cessation of the input pulse(s). The NMR properties of the sample are thus measured both as a function of time and temperature as the heating of the sample proceeds.

From time to time it is necessary to adjust the strength of the magnetic field extending between the pole pieces 2 in order to make the NMR frequency (which is magnetic field strength dependent) equal to the RF input frequency. In addition, it is desirable to adjust the power of the RF input in any conventional way, such as by pulse width control, in order to achieve an optimum output at the terminals T.

It is also necessary to tune the resonant RF circuit which includes the sample. This normally involves the adjustment of a variable capacitor to change the resonant frequency of the circuit to track the temperature induced changes in both the sample and the tuned circuit. In this connection it needs to be borne in mind that the sample forms part of the tuned circuit. An impedance matching capacitor may also be adjusted if desired.

Once these adjustments have been made the output signal, which decays as a function of time, is then recorded. This is then able to be manipulated in conventional fashion by, for example, calculating a Fourier Transform and the second moment. This output signal and its associated temperature and/or time constitute the data of interest.

As the temperature increases, the entire procedure is repeated. Clearly this is a very cumbersome and labour intensive procedure allowing measurements to be taken at about 90 second intervals (minimum) depending upon the dexterity of the operator. Where substantial adjustments are required, the time between measurements may be up to 4 minutes.

The above described prior art procedures and equipment are further described in ADVANCES IN MAGNETIC RESONANCE Volume 12 Edited by J. S. Waugh, Academic Press 1988 pages 385 to 421 $^1$HNMR Thermal Analysis by L. J. Lynch, D. S. Webster & W. A. Barton, and REVIEW OF SCIENTIFIC INSTRUMENTS Volume 50 No. 3, March 1979 pages 390 & 391. D. S. Webster, L. F. Cross & L. J. Lynch.

While it is effective, this prior art measurement technique is somewhat inconvenient, especially as temperature regimes such as a temperature ramp which increases by at least 4° C. per minute with measurements being taken every 30-75 seconds, are of interest.

In order to enable these faster measurements to be taken, a substantially automatic method based upon the abovementioned BRUKER MINISPEC will now be described with reference to FIG. 2.

As seen in FIG. 2, an NMR spectrometer 100 in the form of the abovementioned BRUKER MINISPEC is provided. This prior device has a pair of permanent magnet energized pole pieces 102 which are 12.5 cm in diameter and are spaced apart by a 2.5 cm airgap. The permanent magnets give a magnetic field strength of the order 0.47 T. The prior art device is also provided with two substantially identical field windings 103 located one on each of the pole pieces 102. These field windings 103 enable the magnetic field strength between the pole pieces 102 to be adjusted as necessary.

The prior art device is modified as follows. Located between the pole pieces 102 is a specimen probe 105 having an exterior jacket 106. The probe includes its own heater 107 and thermocouple 108 to respectively heat the specimen and measure the temperature of the specimen. The details of the preferred probe 105 are as described with reference to FIGS. 3-5.

The specimen itself (not illustrated in FIG. 2) is located within an RF coil 109 which forms part of a tuned circuit having a variable capacitor 110. The jacket 106 is also provided with temperature regulation which normally takes the form of a water supplied temperature regulator 111 known per se and schematically illustrated in FIG. 2.

In order to provide better stability of the magnetic field strength, the pole pieces 102 and associated equipment are provided with a magnet heater 104 to maintain the temperature of the magnetic circuit elevated to a predetermined temperature approximately 10° or 20° C.

above ambient temperature. Alternatively the magnetic circuit can be located within a water bath (not illustrated) the temperature of which is controlled.

The prior art spectrometer 100 is provided with a signal receiver 113, a clock frequency source 114, a pulse programmer 115, a pulse gate/phase selector 116, a pulse transmitter 117 and a duplexer 118 which enables pulses from the transmitter 117 to be applied to the RF coil 109 and the resultant signal received therefrom to be applied to the receiver 113. Each of the items 113-118 is substantially conventional.

Added to the prior art spectrometer is a signal digitizer or A to D converter 119 which has a 10 MHz sampling rate, 8 bit resolution, and 2048 data points. The output of the digitizer 119 is applied to a central processing unit (CPU) 120 which is preferably realized by means of a personal computer. The CPU 120 is provided with various peripherals in the form of screen 121, keyboard 122, disc drive 123, plotter 124, and printer 125.

In addition, the CPU 120 is connected to a number of controllers in the form of specimen temperature controller 131, probe tuner 132, magnetic field controller 133, and pulse width controller 136. A magnet temperature controller 134 and probe jacket temperature controller 135 each with manual controls are also provided. The probe jacket temperature controller 135 ensures that the temperature of the jacket 106 surrounding the sample is maintained in order to minimize temperature gradients to which the magnetic circuit may be subjected, while the magnet temperature is itself regulated by means of the magnetic temperature controller 134.

Because the CPU 120 and spectrometer 100 are interconnected, during the heating regime (in the temperature range 25° C.–600° C. for example) in the course of which it is intended to take measurements, the following procedures are carried out. Firstly, the magnetic field controller 133 corrects the magnetic field strength at the sample for any small drifts in the magnetic field which may have occurred over the operating time elapsed hitherto. This is best done by utilizing the NMR signal from the sample under test as a means of sensing the magnetic field for use in feedback control. This has the consequence that the resolution of the magnetic field setting is dependent upon the state of the sample. Thus increased field resolution can be readily achieved with relatively slowly decaying signals where tuning is more critical.

Secondly, the probe tuner 132 adjusts (by means of a stepping motor controlled mechanically variable capacitor) the resonant circuit of the sample, if necessary, in accordance with the measured temperature of the sample as measured by the specimen temperature controller 131. Again the NMR signal from the sample under test can be used in a feedback loop. A manual temperature calibration check can also be made from time to time.

Thirdly, the pulse width controller 136 adjusts the RF power to be supplied as necessary in accordance with the measured temperature of the sample. Either a look up table based on previous experience at the measured temperature, or the sample NMR signal incorporated in a feedback loop, can be used.

With all these pre-conditions substantially simultaneously satisfied, the transmitter 117 then transmits a series of radio frequency pulses as determined by the pulse programmer 115 to the RF coil 109 via duplexer 118. The induced nuclear resonant signal is then transmitted to the receiver 113, amplified and passed via the digitizer 119 to the CPU 120 which records this single measurement. Specimen temperature controller 131 continues to operate so as to increment the temperature of the sample (in accordance with a predetermined regime previously specified via the CPU 120) and the next measurement is made. In this way a series of measurements can be made as the temperature of the sample increases, for example in a linear temperature ramp.

With a desired predetermined temperature regime set by the temperature controller 131, a series of measurements can be taken with predetermined intervals between measurements and/or at predetermined temperatures thereby giving rise to a series of measurements which are stored in CPU 120 or a remote memory such as a disc inserted in the disc drive 123. Alternatively, or additionally, the results can be displayed on the screen 121, plotted on the plotter 124 and/or printed out on the printer 125.

It will be apparent to those skilled in the art that the substantial advantage offered by the spectrometer of the preferred embodiment is that not only can the desired analysis be carried out every 30–75 seconds, but also the data thereby created can be stored and analyzed.

Figure 3:
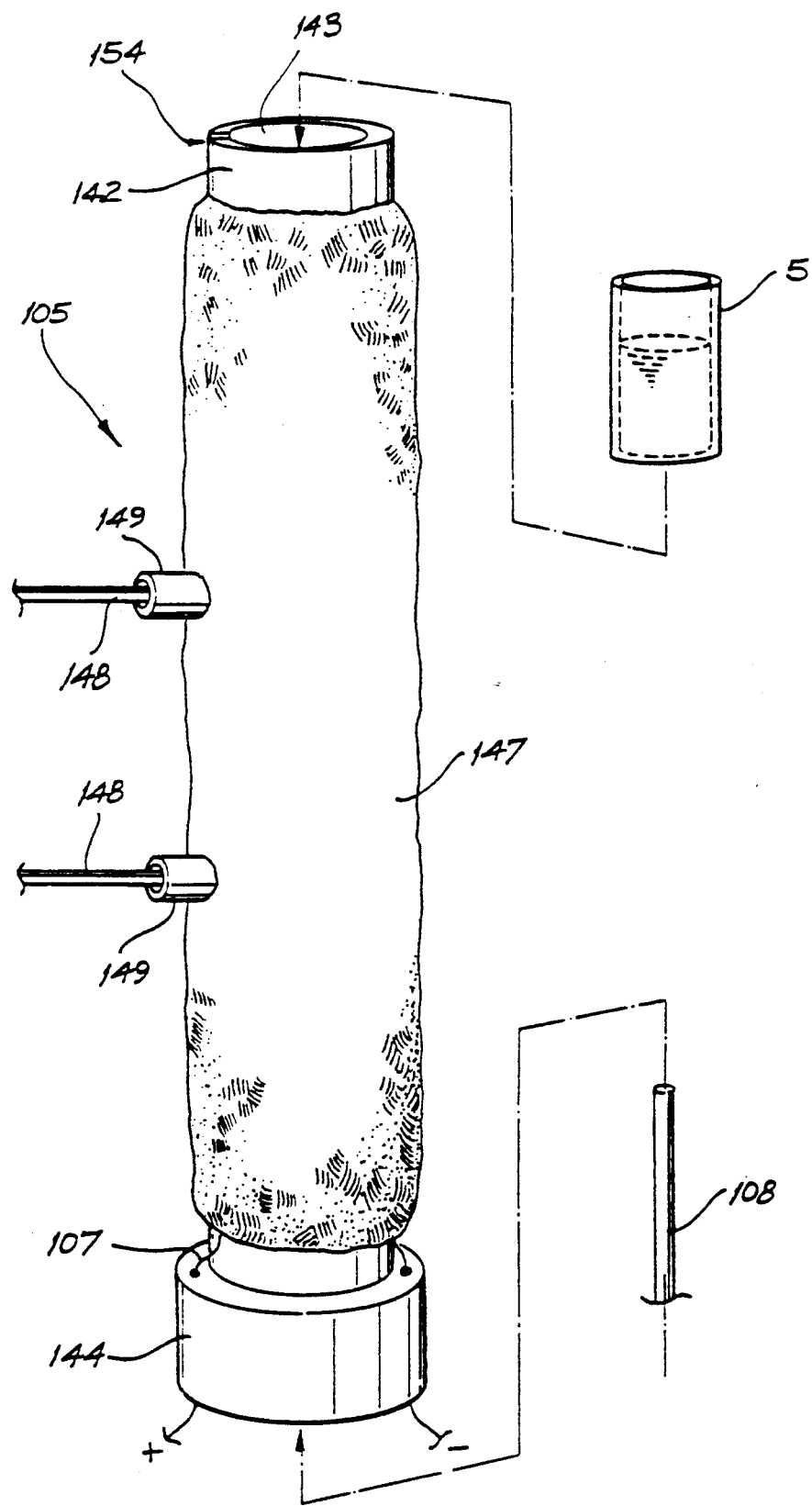
FIG. 3 is a perspective view of the probe of the preferred embodiment.

As seen in FIG. 3, the probe 105 takes the form of an elongate body 142 having a cylindrical opening 143 at its upper end and a base 144 at its lower end. The opening 143 is dimensioned to receive a sample holder 5 which contains a sample to be studied. If the sample is coal, is preferably powdered or granulated, however, the sample can equally be a solid or a liquid.

As will be explained hereafter, the thermocouple 108 is passed through the base 144 in order to lie below the sample holder 5 in order that the temperature of the sample can be indirectly inferred by calibration. The exterior of the probe 105 is covered with a thin coating of alumina-silicate cement 147 such as AREMCO 503 manufactured by AREMCO of the U.S.A. The electrical connections 148 to the radio frequency (RF) coil 109 (illustrated in detail in FIG. 4) extend through the cement 147 and in that region each pass through a corresponding ceramic tube 149 (illustrated in FIG. 4) of short length which is embedded in the cement 147. Similarly, the ends of the heating winding 107 pass through the base 144. This arrangement prevents any inadvertent contact between the RF coil 109 and heater 107.

Turning now to FIG. 4, the interior detail of the probe 105 is illustrated. The body 142 is machined from sintered glass sold under the trade name MACOR by Corning of the U.S.A. A double start thread 152 is cut in the exterior cylindrical surface of the body 142. A cylindrical opening 143 is drilled through the body 142. A narrow longitudinal slot 154 is cut into the side of the opening 143 and extends beyond half the length of the opening 143. A hollow cylindrical plug 151 formed from MACOR and having a central cylindrical aperture 153 is inserted into the lower end of the opening 143. The plug 151 extends less than half the length of the opening 143. The aperture 153 receives the thermocouple 108 as indicated in FIG. 3.

Also formed from MACOR is a hollow cylindrical former 156 the internal diameter of which is sufficient to receive the sample holder 5 and the external diameter of which just fits within the cylindrical opening 143. Cut into the exterior of the former 156 is a flat bottomed, wide cut thread 157 into which a silver or gold wire 158 having a rectangular cross-section (as best illustrated in FIG. 5) is wound. The free ends of the wire 158 constitute the electrical connections 148.

After the former 156 has been wound with the wire 158, the former is passed into the opening 3 with the electrical connections 148 being aligned with, and passed through, the slot 154. The former 156 is then moved along the cylindrical opening 143 and into its final position illustrated in FIG. 4 which is preferably centrally located relative to the heating winding 107. Then the heating winding 107, which is looped back upon itself in known fashion so as to be effectively non-inductive, is wound in the double start thread 152 as illustrated in FIG. 4. Immediately after the heating winding 107 is wound into position, the entire arrangement is covered with the thin layer of cement 147 in order to firmly locate the components in place.

It will be apparent to those skilled in the art that the abovementioned arrangement provides a number of substantial advantages. Firstly, the RF coil 109 is held in position between the thread 157 and the interior of the cylindrical opening 143. Thus not only is the RF coil 109 accurately held in its desired location, but it is not surrounded by any large volume of undesirable (e.g. proton containing) material.

It will also be appreciated by those skilled in the art that the thermocouple 108 must be spaced from the sample holder 5 in order not to distort the actual measurement. In order that the thermocouple 108 actually measures the temperature of the sample held in the holder 5, a calibration procedure is previously carried out. Here an additional thermocouple is placed in a typical sample and the temperature of the probe 105, say, increased from lowest to highest. The actual temperature of the sample recorded by the additional thermocouple is then matched with the readings taken at the same time by the thermocouple 108 to arrive at a calibration adjustment for the thermocouple 108.

The foregoing describes only one embodiment of the present invention and modifications, obvious to those skilled in the art, can be made thereto without departing from the scope of the present invention.

For example, although the double start thread 12 illustrated in FIG. 4 has its pitch distance greater than the thread to thread distance, it is preferred that these two distances be made equal. Furthermore, although the wire 158 preferably has a rectangular cross-section for use at 60 MHz, for use at 20 MHz wire of circular cross-section will suffice.

Furthermore, before taking a measurement, the receiver 113 preferably has its gain adjusted to a known relative value so that its output signal amplitude is appropriate for the input voltage range of the digitizer 119.

As the signal/noise ratio (S/N) of a single measurement is normally not large enough for good analysis (particularly both as the temperature increases and the sample loses hydrogen), this can be improved by adding a number of successive single measurements together to produce one averaged result. To do this the rate at which each single measurement is repeated is set so that it is sufficiently slow to avoid NMR signal saturation effects—otherwise the signal will be attenuated and the amplitude information may not be properly representative and analysis would at best be difficult if not meaningless.

Alternatively, this sensitivity to measurement rate can be used in a PMRTA procedure whereby information on the NMR signal saturation, or spin lattice relaxation phenomena, can be recorded. Thus for transverse relaxation measurements the rate of measurement must be much slower than the spin lattice relaxation rate.

Finally, the number (NS) of successive single measurements added together is preferably an adjustable parameter which is set by trading off the increased S/N with larger NS against the time (and hence sample temperature change) over which these NS are acquired.

Set out in the APPENDIX hereto is the program listing of the FORTRAN data acquisition program implemented by the CPU 120. The detailed subroutines which are referred to are not listed in detail. The stepper motor referred to is used to control an adjustable capacitor in the RF tuner 132.

COPYRIGHT NOTICE

The program listing contained in the APPENDIX is copyright and remains the property of COMMONWEALTH SCIENTIFIC AND INDUSTRIAL RESEARCH ORGANISATION and is not to be implemented or duplicated in written or electronic form without the express prior written approval of that organisation. The publication of the program listing together with this patent specification is with the approval of, and on behalf of, the copyright owner.

APPENDIX

```
C Proton Magnetic Resonance Thermal Analysis data acquisition program.
C+
C PMRTA
C Main program for NMR spectrometer operation, using
C               ECS-286 (IBM/XT) computer;
C               Bruker Minispec spectrometer;
C               PCTR-160 for data acquisition - IRQ 3
C               REX-P100 temperature controller - serial port COM1, IRQ 4
C               TRONICS 2000 stepper motor controller;
C               IOSA I/O card (2 RS-232 and 1 LPT lines)
C               EPSON FX-800 printer - LPT1
C               FACIT plotter.
C
C INPUTS:   A control file, containing calibration filenames (for sample
C           temperature and amplitude correction) and initial parameter
C           values.
C
```

```
C OUTPUTS: Data files to disk, acquisition information to printer and
C          data to screen.
C
C ERRORS:  Error messages are displayed on screen as appropriate.
C
C EXAMPLE:
C
C SIDE-EFFECTS: None known
C
C OTHER SOFTWARE REQUIRED: Fortran and assembly language routines (see
C                          the link file, PML)
C
C------------------------------------------------------------------
C        Named COMMON blocks.
         INCLUDE CALIBR.CMN
         INCLUDE HEADR.CMN
         INCLUDE PARAM.CMN
         INCLUDE TIMER.CMN
         INCLUDE PCTR.CMN
         INCLUDE REXP.CMN
         INCLUDE PC120.CMN
         INCLUDE STEPR.CMN
         INCLUDE MESAGE.CMN
C
C        COMMON /CALIBR/ NSAMP, SAMP1, SAMP2, NCHAR, CHAR1, CHAR2,
C        $               NPLSW, PLSW1, PLSW2, NTCAP, TCAP1, TCAP2,
C        COMMON /HEADR/ FDATE, OPINIT, OVENUM, PRONUM,
C        $              IDTEXT, IDNUM, NEWSAM, CALFIL,
C        $              BMDIAN, SDEVL, SDEVU, T1
C        COMMON /PARAM/ NSWEEP, DWELL, NDATA, NBASEL, IATTEN, VGAIN,
C        $              PSDDIO, TAU, REPTIM, HRATE, TEMMAX, HOLTIM,
C        $              COOLRA, PULSWI
C        COMMON /TIMER/ KEYCOD, TOFDAY, FLG1CH
C        COMMON /PCTR/ NS, ND, DSPFLG, IACCUM, NDW, NSDONE, IDATA
C        COMMON /REXP/ TREQFL, TDISFL, REQTIC, RTEMPC,
C        $             RIPSTR, ROPSTR, RXFLAG, ERREX
C        COMMON /PC120/ MEASFL, NPC120, OPCODE, MEAS, ENT, NEXT, ENH,
C        $              ATT, RD, PS, APS, DUR, PHASE, MODE, BW, DPOINT,
C        $              KARAY
C        COMMON /STEPR/ NSTEPR, AUTSPD, MANSPD
C        COMMON /MESAGE/ STRING, STR1
C
C------------------------------------------------------------------
C        Variable declarations
C        ERR              General error flag
C        MONO     Required for ADAPTR
C        CGA         "       "    "
C        EGA         "       "    "
C        ACTIVE      "       "    "
C        ERRCOM   Required for COMTX (assembly language; argument)
         LOGICAL*1 ERR, MONO, CGA, EGA
         INTEGER*2 ACTIVE, ERRCOM
C
C------------------------------------------------------------------
C        Type program identification and heading.
         WRITE (*, 10)
10       FORMAT (' <PMRTA>...Version: Prototype. May-88/June-89 (DSW)'//
        $' *1 Programme to control PMR pyrolysis experiment using:'/
        $'        ECS-286 (IBM/XT) computer;'/
        $'        Bruker Minispec spectrometer (with added interface);'/
        $'        PCTR-160 for data acquisition - IRQ 3;'/
        $'        REX-P100 temperature controller - COM1, IRQ 4;'/
        $'        TRONICS 2000 stepper motor controller;'/
        $'        IOSA I/O card (2 serial, 1 parallel lines);'/
        $'        EPSON FX-800 printer (LPT1) and FACIT plotter.'///
        $' *2 A control file, containing calibration filenames'/
        $'    and initial parameter values will be requested.'///
        $' *3 All commands are input from the function keys, numeric'/
        $'    keypad, and with the arrows and <RETURN> key.'/
        $'    (A template will show their functions).'///
        $' *4 Data files will be written to default directory.'/
        $'    Make sure there is enough free space.'/)
```

```
c
          PAUSE ' [ENTER] to continue. CTRL/C to return to monitor.'
c
c-------------------------------------------------------------------
c         Allocate 'many' bytes of stack storage for assembly (non-F77L)
c         routines - the default is 240, see p.12-8 F77L manual.
          CALL ENSSTK(16000)
c
c-------------------------------------------------------------------
c         Check that EGA card is present (use TEKMAR subroutine)
          CALL ADAPTR (MONO, CGA, EGA, ACTIVE)
          IF (.NOT. EGA) STOP ' <PMRTA>...The EGA card is required by this
         $programme.'
c
c-------------------------------------------------------------------
c         Set EGA to mode 16 and write mode 0.
          CALL SAVMOD                    !save screen mode (subr. in SCRMOD).
          CALL HRMOD0                    !      "       "
c
c-------------------------------------------------------------------
c     Initialise all parameters (control file) and read calibration data.
          CALL INITAL
c
c-------------------------------------------------------------------
c         Request operator and sample information.
          CALL SAMPID
c
c-------------------------------------------------------------------
c         Reset EGA to mode 16 and write mode 0. (i.e. clear screen!)
          CALL HRMOD0
c
c-------------------------------------------------------------------
c         Set up serial port COM3 for Minispec PC-120 communication.
c         Load base address into 40:0004,5
          CALL COMBAS (NPC120, 824)                !824=338H
c         2400 baud, no parity, 1 stop bit, 8 data bits, no interrupts.
          CALL COMSET (NPC120, 2400, 0, 1, 8, 0)
c         Set the RTS line active (required for Minispec communication)
          CALL COMRTS (NPC120, 1)
c-----
          PAUSE '<PMRTA>...Bring Minispec up to accept commands stage.'
c-----
c         Set the PSD/Diode MODE in Minispec. (It is assumed that the
c         Minispec initialises to PSD mode). The PSDDIO flag is passed
c         in via the control file in INITAL.
          IF (.NOT. PSDDIO) THEN
                  COUNT = 0
c                 Set MODE = DIODE
20                OPCODE = MODE//NEXT//ENT
                  CALL COMTX (NPC120, OPCODE, 3, ERRCOM)
                  IF (ERRCOM .NE. 0) THEN
c                         Error in transmission
                          STRING = '<PMRTA>...Error in Minispec set MODE.'
                          CALL MESDIS. (STRING, 37)
                          COUNT = COUNT+1
                          IF (COUNT .GT. 1) THEN
                                  CALL RSTMOD
                                  STOP '<PMRTA>...Stop because of *!# Minispec.'
                          ENDIF
                          PAUSE 'Check Minispec is on, and try once more.'
                          GO TO 20
                  ENDIF
          ENDIF
c
c         Set the REPTIM and ATTEN in Minispec
          COUNT = 0
21        IDUMY = NINT (REPTIM*100.)         !REPTIM = xx.xx sec
          IRTENS = IDUMY/1000
          IUNITS = (IDUMY - IRTENS*1000)/100
          IDEC = (IDUMY - IRTENS*1000 - IUNITS*100)/10
          ICENT = (IDUMY - IRTENS*1000 - IUNITS*100 - IDEC*10)
c
```

```
         ITENS = IATTEN/10          !IATTEN = xx
         IUNIS = IATTEN - ITENS*10
C
C        Load the values
         OPCODE = RD//KARAY(IRTENS+1)//KARAY(IUNITS+1)//DPOINT//
     $           KARAY(IDEC+1)//KARAY(ICENT+1)//ENT//
     $           ATT//KARAY(ITENS+1)//KARAY(IUNIS+1)//ENT
         CALL COMTX (NPC120, OPCODE, 11, ERRCOM)
         IF (ERRCOM .NE. 0) THEN
C                An error in transmission:
                 WRITE (STRING, 25) ERRCOM
25               FORMAT('<PMRTA>..Tx error (reptim, atten update), ERRCOM= ',I1)
                 CALL ERRDIS (STRING, 51)
                 COUNT = COUNT+1
                 IF (COUNT .GT. 1) THEN
                         CALL RSTMOD
                         STOP '<PMRTA>...Stop because of *!# Minispec.'
                 ENDIF
                 PAUSE 'Check Minispec is on, and try once more.'
                 GO TO 21
         ENDIF
C--------------------------------------------------------------------
C        Set up serial port COM4 for Stepper motor communication.
C        Load base address into 40:0006,7
         CALL COMBAS (NSTEPR, 568)           !568=238H
C        9600 baud, no parity, 1 stop bit, 8 data bits, no interrupts.
         CALL COMSET (NSTEPR, 9600, 0, 1, 8, 0)
         COUNT = 0
C        Initialise some stepper motor parameters
30       OPCODE = ',@1,A50,D50,B50,M50,'
         CALL COMTX (NSTEPR, OPCODE, 20, ERRCOM)
         IF (ERRCOM .NE. 0) THEN
C                Error in transmission
                 STRING = '<PMRTA>...Error in Tx stepper initialisation.'
                 CALL MESDIS (STRING, 45)
                 COUNT = COUNT+1
                 IF (COUNT .GT. 1) THEN
                         CALL RSTMOD
                         STOP '<PMRTA>...Stop because of *!# stepper motor.'
                 ENDIF
                 PAUSE 'Check stepper motor is on, and try once more.'
                 GO TO 30
         ENDIF
C--------------------------------------------------------------------
C        Reset EGA to mode 16 and write mode 0. (i.e. clear screen!)
         CALL HRMOD0
C
C--------------------------------------------------------------------
C        Set up serial port COM1 for REX-P100 temperature controller
C        and attach REXISR to IRQ 4 (INT 0CH)
         CALL SAV0CH                         !save vector at 0CH
         CALL INT0CH
         CALL COMSET (1, 9600, 0, 1, 8, 1)   !9600baud,no par,1stop,8 data
C                                            !and enable receive interrupt
         CALL IMRSET (239)      !enable IRQ 4 (1110 1111B) - COM1, REXISR
C
C        Set up REX-P100 parameters for the heating profile.
         CALL REXSET
C--------------------------------------------------------------------
C        Display the key function template on rows 21-24
         NMENU = 0
         CALL KEYDSP (NMENU)
C        Display the parameter values for FN keys on rows 21-22
         NCOM = 0
         CALL PARUPD (NCOM, NMENU)
C
C        Draw a box around the signal area (lt.blue)
         ICOLOR = 3
         CALL SBOX (ICOLOR)
C
C        Display colons on line 0, columns 74, 77 (for time display)
CC       CALL COLON
```

```
C
C------------------------------------------------------------------
C       Ensure the K/B buffer is clear before attaching TIMINT to INT 1CH
        CALL KBUFCL
C       Attach clock display, keyboard scan and 'temperature request' code
C       to INT 1CH (TIMINT).
        CALL SAV1CH              !save vector at 1CH (subr. in INT1CH).
        CALL INT1CH
C
C       Initiate 'temp. requests' from TIMINT, to NPC120.
        TREQFL = .TRUE.          !enable 'requests' to be sent from TIMINT
C------------------------------------------------------------------
C       Attach signal averaging and display PCTISR to INT 0BH (IRQ 3)
        CALL SAV0BH
        CALL INT0BH              !Attachs PCTISR to INT 0BH
C
C       Enable interrupt IRQ 3, and arm the PCTR-160 (external trigger).
        CALL IMRSET (247)        !IRQ 3 (1111 0111B) - PCTISR
        CALL ARMPCT              !Latches dwell & writes to 371H & D000H.
C------------------------------------------------------------------
C Wait for K/B entry, translate to INTEGERs and re-enable scan code
40      CALL KBWAIT (INT1, INT2)
C
C       Translate K/B entry to a command number (returned in INT1)
        CALL KEYCOM (INT1, INT2)
        IF (INT1 .EQ. 0) GO TO 40    !Error messages handled by KEYCOM
C
C       Execute the command
        CALL COMAND (INT1)
        IF (INT1 .NE. 100) GO TO 40  !100 is the EXIT command
C------------------------------------------------------------------
C       Exit procedure
        TREQFL = .FALSE.
        CALL COMSET (1, 0, 0, 1, 8, 0)  !disable serial port interrupts
        CALL IMRSET (-248)       !Disable interrupts IRQ 3 (-248) and 4 (-240).
        CALL IMRSET (-240)
        CALL IMRSET (188)        !enable IRQ 0, 1 and 6 (timer, K/B & floppy)
        CALL RST0CH              !Assembly language, in INT0CH.ASM
        CALL RST0BH              !Assembly language, in INT0BH.ASM
        CALL RST1CH              !Assembly language, in INT1CH.ASM
        CALL RSTMOD              !Assembly language, in SCRMOD.ASM
C
C       Stop 'measurement' in progress
        OPCODE = NEXT//ENT
        CALL COMTX (NPC120, OPCODE, 2, ERRCOM)
        IF (ERRCOM .NE. 0) THEN
C               An error in transmission:
                WRITE (STRING, 50) ERRCOM
50      FORMAT('<PMRTA>...Tx error (stop measure), ERRCOM= ', I1)
                CALL ERRDIS (STRING, 44)
        ENDIF
C       Load APS-0, in preparation for Minispec power-off
        OPCODE = APS//KARAY(1)//ENT
        CALL COMTX(NPC120, OPCODE, 3, ERRCOM)
        IF (ERRCOM .NE. 0) THEN
C               An error in transmission:
                WRITE (STRING, 51) ERRCOM
51      FORMAT('<PMRTA>...Tx error (load APS0), ERRCOM= ', I1)
                CALL ERRDIS (STRING, 41)
        ENDIF
C
        CALL LPL0(2)      !De-select digital pulsewidth relay
        CALL DAOUT (632, 2048)   !Reset D/A converter to 0V output.
C
        STOP ' <PMRTA>...Exit gracefully via operator command.'
        END
```

We claim:

1. A method of carrying out proton magnetic resonance thermal analysis measurements, said method comprising the steps of:
   i) locating a sample within a coil forming part of an RF tuned circuit and applying a magnetic field to said sample,
   ii) heating said sample in accordance with a predetermined temperature regime,
   iii) applying pulsed RF energy to said coil to generate a pulsed RF electromagnetic field which is applied to said sample, and thereafter substantially simultaneously,
   iv) adjusting the magnitude of said magnetic field to ensure that the NMR frequency of said sample is substantially identical to the RF frequency,
   v) adjusting the resonant frequency of the tuned circuit, if necessary, to compensate for temperature induced changes in the tuned circuit components and sample,
   vi) adjusting the energy of said pulsed RF energy to obtain an optimum output from said RF tuned circuit,
   vii) recording the RF tuned circuit output as a function of either the time or the temperature of said sample, and
   viii) repeating steps (iv) to (vi) as necessary at each desired time or sample temperature to obtain an optimum RF tuned circuit output, and repeating step (vii).

2. A method as claimed in claim 1 wherein the magnetic field is controlled in accordance with the RF tuned circuit output.

3. A method as claimed in claim 1 wherein step (viii) is repeated a plurality of times to increase the signal to noise ratio of the measurement, the results of the individual measurements being added together and averaged, and the number of times step (viii) is repeated being adjustable.

4. A method as claimed in claim 3 wherein the rate at which measurements are taken in selectable in order to attain a preselected level of NMR signal saturation.

5. A method as claimed in claim 1 wherein steps (iv) to (vii) are repeated within a time in the range of from 30 to 75 seconds.

6. A proton magnetic resonance thermal analyzer comprising an RF tuned circuit including an RF coil into which an NMR sample is insertable, said RF coil being locatable in a magnetic field, magnetic field strength means to adjust the magnitude of said magnetic field, RF pulse means connected to said RF tuned circuit to supply same with pulsed RF energy, an RF controller connected to said RF pulse means to adjust the magnitude of said RF energy, an RF tuner connected to said RF tuned circuit and a heater to substantially increase the temperature of said sample above ambient temperature, wherein each of said magnetic field strength means, said RF controller, said RF tuner and said heater is connected to a central processing unit and is both simultaneously and individually controlled thereby.

7. An analyzer as claimed in claim 6 wherein the output of said RF tuned circuit is connected to said central processing unit via a digitising means and a storage means is connected to said central processing unit, the output of said RF tuned circuit at the cessation of said RF pulsed energy being stored in digital form in said storage means.

8. A high temperature heater probe for nuclear magnetic resonance measurements, said probe comprising an elongate body having an opening at one end, a tubular former carrying an RF coil located within said opening with the electrical connections to said RF coil passing through said body, the interior of said former being dimensioned to receive an NMR sample holder, a heater coil non-inductively wound along said elongate body and a layer of heat resistant substantially proton deficient cement covering said heater coil and through which said electrical connections to said RF coil pass.

9. A probe as claimed in claim 8 wherein said opening in said body comprises a cylindrical opening having a longitudinally extending slot extending between the interior of said opening and the exterior of said body, said slot extending approximately half the longitudinal extent of said body, and said RF coil connections passing from said opening through said slot to the exterior of said body.

10. A probe as claimed in claims 8 or 9 wherein said RF coil is located in a groove cut in the exterior of said tubular former and said heater coil is located in a groove cut in the exterior of said elongate body.

11. An analyzer as claimed in claim 6 wherein said RF coil and heater comprise the RF coil and heater of the probe as claimed in claims 7, 8, 9 or 10.

12. An analyzer as claimed in claim 6 further comprising temperature heater probe for nuclear magnetic resonance measurements, said probe comprising an elongate body having an opening at one end, a tubular former carrying an RF coil located within said opening with the electrical connections to said RF coil passing through said body, the interior of said former being dimensioned to receive an NMR sample holder, a heater coil non-inductively wound along said elongate body and a layer of heat resistant substantially proton deficient cement covering said heater coil and through which said electrical connections to said RF coil pass.

13. An analyzer as claimed in claim 12, wherein said opening in said body comprises a cylindrical opening having a longitudinally extending slot extending between the interior of said opening and the exterior of said body, said slot extending approximately half the longitudinal extent of said body, and said RF coil connections passing from said opening through said slot to the exterior of said body.

14. An analyzer as claimed in claim 13, wherein said RF coil is located in a groove cut in the exterior of said tubular former and said heater coil is located in a groove cut in the exterior of said elongate body.

* * * * *